US011315809B2

(12) United States Patent
Hashiguchi

(10) Patent No.: US 11,315,809 B2
(45) Date of Patent: Apr. 26, 2022

(54) DEVICE AND FORMING METHOD OF DEVICE

(71) Applicant: JAPAN AVIATION ELECTRONICS INDUSTRY, LIMITED, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 0 days.

(21) Appl. No.: 17/153,298

(22) Filed: Jan. 20, 2021

(65) Prior Publication Data
US 2022/0037174 A1 Feb. 3, 2022

(30) Foreign Application Priority Data

Aug. 3, 2020 (JP) .............................. JP2020-131418

(51) Int. Cl.
*H01L 21/67* (2006.01)
*B29C 65/20* (2006.01)
*B29C 65/00* (2006.01)

(52) U.S. Cl.
CPC ........ *H01L 21/67103* (2013.01); *B29C 65/20* (2013.01); *H01L 21/67126* (2013.01); *B29C 66/1122* (2013.01)

(58) Field of Classification Search
CPC ......... H01L 21/67103; H01L 21/67126; B29C 65/20; B29C 66/1122
See application file for complete search history.

(56) References Cited

U.S. PATENT DOCUMENTS 6,045,652 A * 4/2000 Tuttle .................... G01S 13/758
156/278
7,033,857 B2 * 4/2006 Munakata ............. H01L 21/561
438/106
(Continued)

FOREIGN PATENT DOCUMENTS

JP 2001332654 A 11/2001
JP 2007287635 A 11/2007
(Continued)

OTHER PUBLICATIONS

Related U.S. Appl. No. 17/152,877; First Named Inventor: Shinji Ueda; Title: "Device and Forming Method of Device"; filed Jan. 20, 2021.
(Continued)

*Primary Examiner* — Michael N Orlando
*Assistant Examiner* — Abhishek A Patwardhan
(74) *Attorney, Agent, or Firm* — Holtz, Holtz & Volek PC

(57) ABSTRACT

A device comprises a first seal member, a second seal member, a first circuit member, a second circuit member and one or more compressive members. The first seal member has a first outer portion having a first seal portion, and a first inner portion located inward of the first outer portion. The second seal member has a second outer portion having a second seal portion, and a second inner portion located inward of the second outer portion. The first seal portion and the second seal portion are bonded together. The first circuit member and the second circuit member are shut in a closed space which is enclosed by the first inner portion and the second inner portion. One of the compressive members is located between the first seal member and the first circuit member or located between the second seal member and the second circuit member.

15 Claims, 11 Drawing Sheets

(56) References Cited

U.S. PATENT DOCUMENTS

| | | | |
|---|---|---|---|
| 9,276,234 B2 | 3/2016 | Park | |
| 10,202,525 B2 | 2/2019 | Park et al. | |
| 2001/0007335 A1 | 7/2001 | Tuttle et al. | |
| 2006/0033188 A1 | 2/2006 | Chen et al. | |
| 2010/0230151 A1* | 9/2010 | Michalk | H05K 1/183 |
| | | | 174/260 |
| 2013/0115735 A1 | 5/2013 | Chen et al. | |
| 2014/0110685 A1* | 4/2014 | Hong | H01L 27/32 |
| | | | 257/40 |
| 2018/0358770 A1* | 12/2018 | Light | H01R 12/7082 |
| 2020/0028145 A1 | 1/2020 | Kano et al. | |
| 2020/0220055 A1 | 7/2020 | Kitaura et al. | |

FOREIGN PATENT DOCUMENTS

| | | |
|---|---|---|
| JP | 2010287635 A | 12/2010 |
| JP | 2018186064 A | 11/2018 |
| TW | 201338236 A | 9/2013 |
| TW | 201438307 A | 10/2014 |
| TW | 201518457 A | 5/2015 |
| TW | 201818581 A | 5/2018 |
| TW | 201843777 A | 12/2018 |
| TW | 201913829 A | 4/2019 |

OTHER PUBLICATIONS

Extended European Search Report (EESR) dated Jul. 15, 2021, issued in European Application No. 21152624 (which is a European counterpart of related U.S. Appl. No. 17/152,877).

Taiwanese Office Action (and English language translation thereof) dated Oct. 5, 2021, issued in counterpart Taiwanese Application No. 110100939.

Taiwanese Office Action and Search Report (and English language translation thereof) dated Dec. 9, 2021, issued in Taiwanese Application No. 110100938 (which is a Taiwanese counterpart of related U.S. Appl. No. 17/152,877).

* cited by examiner

DEVICE AND FORMING METHOD OF DEVICE

CROSS REFERENCE TO RELATED APPLICATIONS

This application is based on and claims priority under 35 U.S.C. § 119 to Japanese Patent Application No. JP 2020-131418 filed Aug. 3, 2020, the content of which is incorporated herein in their entirety by reference.

BACKGROUND OF THE INVENTION

This invention relates to a device comprising a circuit member sealed by a film.

For example, a device which can be made thinner is disclosed in JP2001-332654A (Patent Document 1), the content of which is incorporated herein by reference.

Referring to FIG. 19, Patent Document 1 discloses a module (device) 90 with built-in semiconductor chips. The device 90 comprises a thermosetting resin composition (sealing resin) 92 and a circuit member 94 including semiconductor chips 96 and wiring patterns 98. The sealing resin 92 is formed so that the circuit member 94 is embedded therewithin. Then, a surface of the sealing resin 92 is polished so that the device 90 is made thinner.

Further reduction in thickness is required for a device comprising a circuit member.

SUMMARY OF THE INVENTION

It is therefore an object of the present invention to provide a new device which can be made thinner.

An aspect of the present invention provides a device comprising a first seal member, a second seal member, a first circuit member, a second circuit member and one or more compressive members. The first seal member is formed of a film and has a first inner portion and a first outer portion. The first inner portion is located inward of the first outer portion. The second seal member has a second inner portion and a second outer portion. The second inner portion is located inward of the second outer portion. The first outer portion has a first seal portion. The second outer portion has a second seal portion. The first seal portion and the second seal portion are bonded together to form a seal trace. The device is formed with a closed space which is enclosed by the first inner portion and the second inner portion. The first circuit member and the second circuit member are shut in the closed space. The first circuit member comprises a first contact point. The second circuit member comprises a second contact point. The first contact point and the second contact point are in contact with each other. The compressive members are shut in the closed space. The compressive members include at least one of a first compressive member and a second compressive member. The first compressive member is, at least in part, located between the first seal member and the first contact point. The second compressive member is, at least in part, located between the second seal member and the second contact point. Each of the compressive members has a body and two main surfaces. The two main surfaces of each of the compressive members are located opposite to each other in a predetermined direction across the body. A part of air contained in the body of each of the compressive members is discharged.

According to the device of an aspect of the present invention, the first seal member and the second seal member overlap with each other to be in contact with each other while the first circuit member, the second circuit member (hereafter, simply referred to as "circuit members") and the compressive members are sandwiched therebetween. The first film is formed of a film. The compressive members can be compressed to be thinner. The structure of each of the circuit members is not restricted except that each of the circuit members should be provided with the contact point. Thus, each of the circuit members of an aspect of the present invention has a simple structure and can be formed of various material. For example, each of the circuit members may be an insulation film formed with a conductive pattern having the contact point. In this instance, the thickness of the whole device can be made extremely thin. Thus, an aspect of the present invention provides a new device which can be made thinner.

An appreciation of the objectives of the present invention and a more complete understanding of its structure may be had by studying the following description of the preferred embodiment and by referring to the accompanying drawings.

Figure 1:
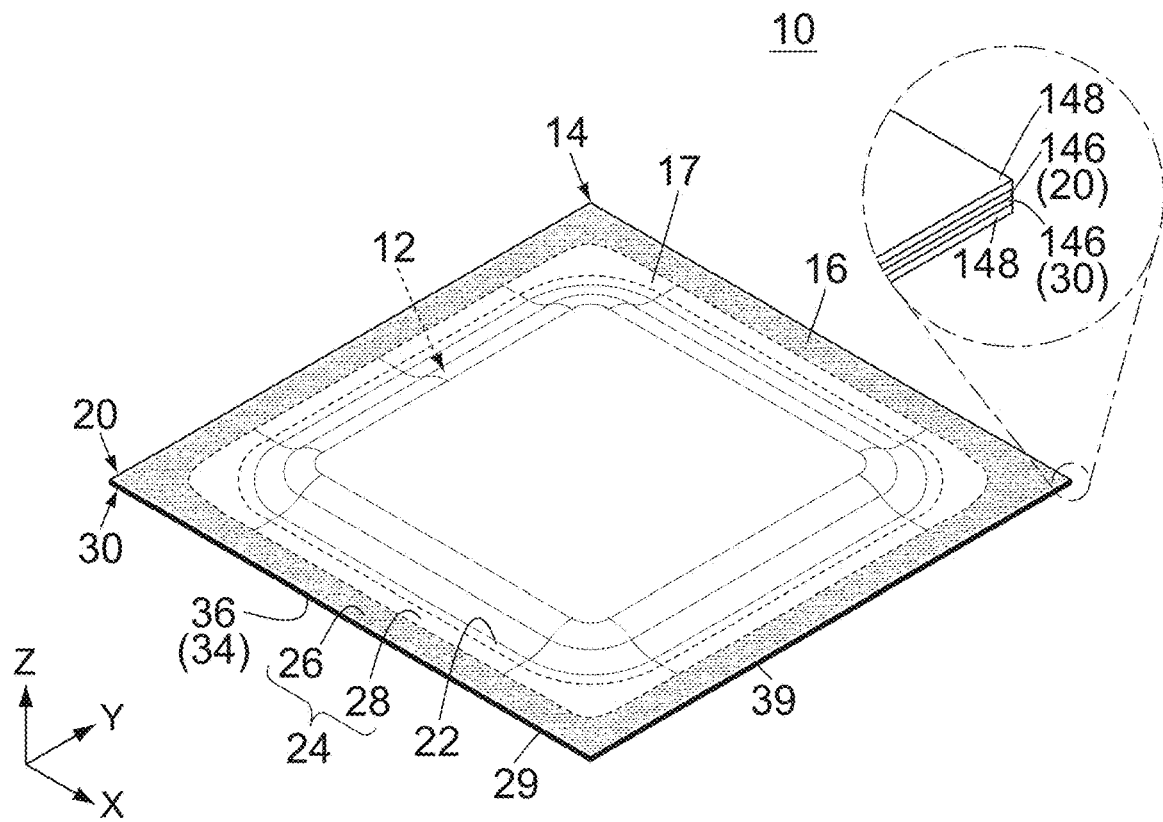
FIG. 1 is a perspective view showing a device according to an embodiment of the present invention, wherein boundary lines of a contact region formed between a first seal member and a second seal member are illustrated with dashed line, and a part of the device enclosed by chain dotted lines is enlarged and illustrated.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 2:
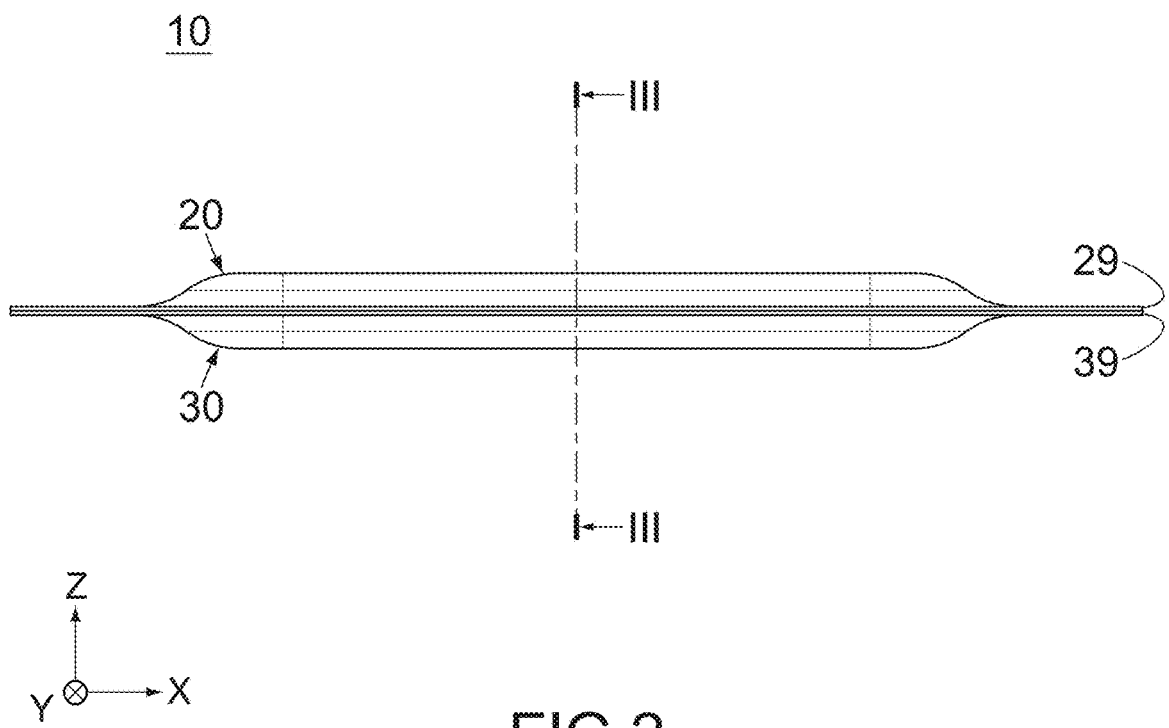
FIG. 2 is a side view showing the device of FIG. 1.

Referring to FIGS. 1 and 2, a device 10 according to an embodiment of the present invention is an independent electronic device. More specifically, the device 10 can work solely without physically attached to another electronic device (not shown). For example, the device 10 measures the heart rate of a subject by attaching the device 10 near the heart of the subject, and transmits the measurement result to another electronic device. Thus, the device 10 can be used as an electronic device for measuring biological information such as heart rate. However, the present invention is not limited thereto but is applicable to various devices having various functions.

Figure 3:
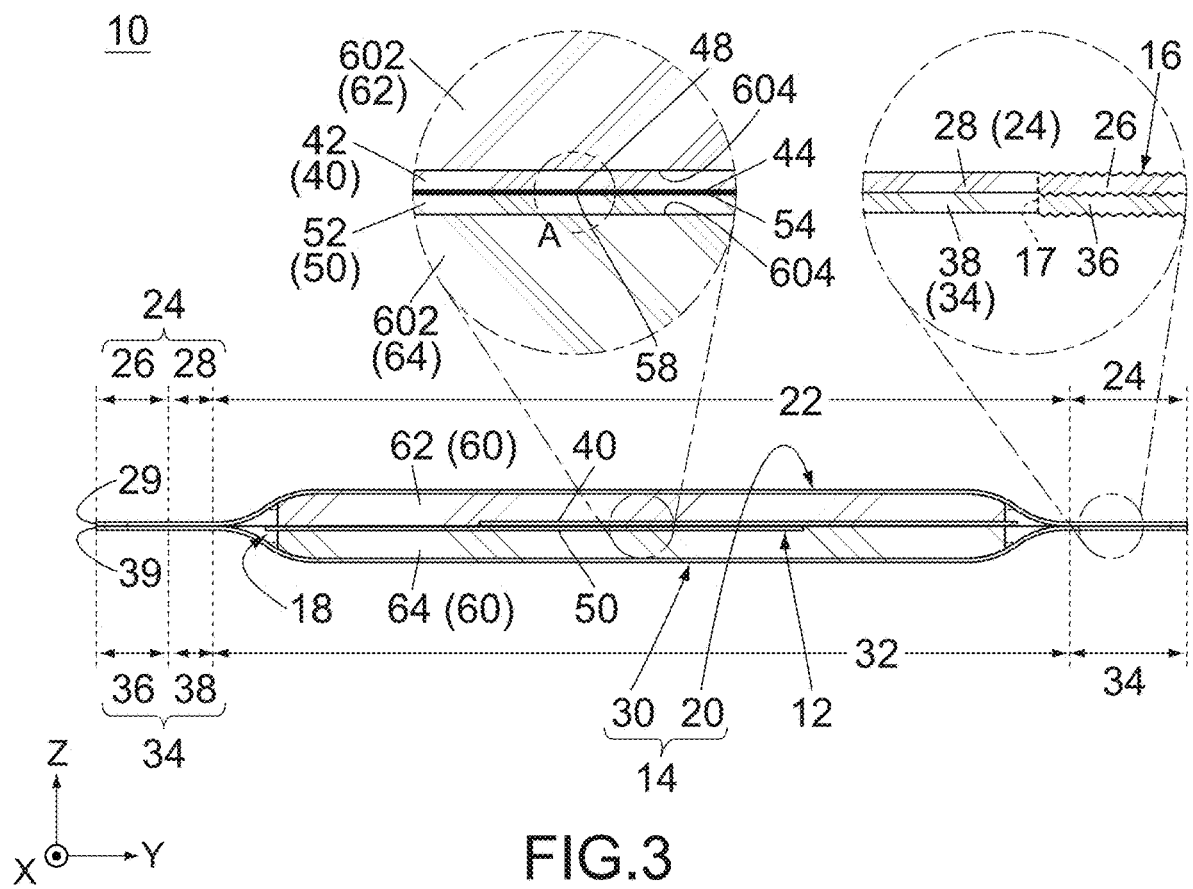
FIG. 3 is a cross-sectional view showing the device of FIG. 2, taken along line III-III, wherein two parts of the device each enclosed by chain dotted lines are enlarged and illustrated, and a boundary of the contact region is illustrated with dashed line in one of the enlarged view.
Figure 8:
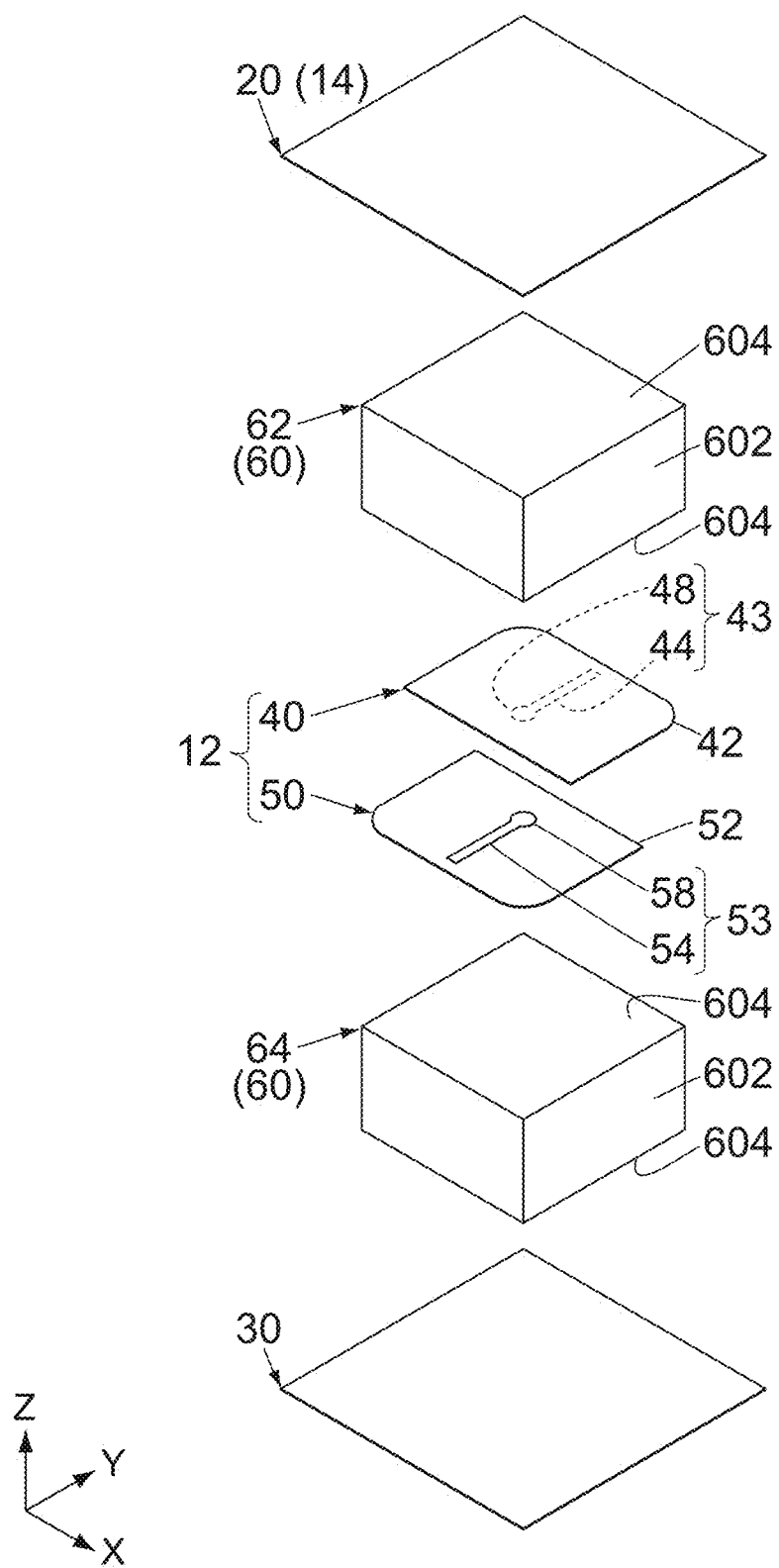
FIG. 8 is a perspective view showing a device material set which is prepared in a preparing step of the forming method of FIG. 7, wherein outlines of the hidden first circuit is illustrated with dashed line.

Referring to FIGS. 1, 3 and 8, the device 10 of the present embodiment comprises a circuit structure 12, a seal member (film member) 14 and two compressive members 60. The circuit structure 12 is a member for enabling the device 10 to work as an electronic device. For example, the circuit structure 12 has an electronic circuit (not shown) for measuring heart rate and another electronic circuit (not shown) for transmitting the measurement result to another electronic device (not shown). Referring to FIG. 3, the film member 14 accommodates the whole circuit structure 12 together with the whole compressive members 60 therewithin. Thus, the circuit structure 12 and the compressive members 60 are shut in the film member 14, and the film member 14 protects the circuit structure 12 from an external environment.

Hereafter, explanation will be made about the structure of the device 10 of the present embodiment.

Referring to FIGS. 3 and 8, the circuit structure 12 of the present embodiment comprises a first circuit member 40 and a second circuit member 50. The film member 14 of the present embodiment comprises a first seal member 20 made of insulator and a second seal member 30 made of insulator. The compressive members 60 of the present embodiment include a first compressive member 62 which can be compressed by pressure and a second compressive member 64 which can be compressed by pressure. Thus, the device 10 comprises the first seal member 20, the second seal member 30, the first circuit member 40, the second circuit member 50, the first compressive member 62 and the second compressive member 64.

Figure 5:
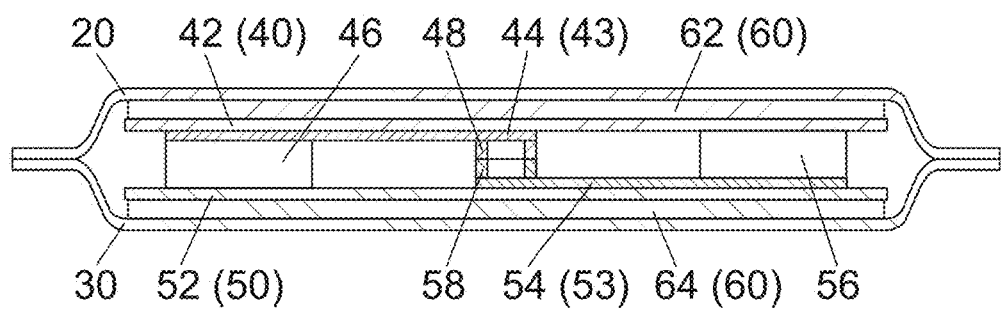
FIG. 5 is a cross-sectional view schematically showing a specific example of the device of FIG. 3.

Referring to FIGS. 3 and 5, the aforementioned six members, i.e., the first seal member 20, the second seal member 30, the first circuit member 40, the second circuit member 50 the first compressive member 62 and the second compressive member 64, are stacked in an upper-lower direction (Z-direction) and are combined to form one of the device 10. The device 10 of the present embodiment comprises only the aforementioned six members. However, the present invention is not limited thereto, but the device 10 may further comprise another member in addition to the aforementioned six members. For example, the device 10 may further comprise an additional circuit member. Instead, the device 10 may comprise only one of the first compressive member 62 and the second compressive member 64.

Referring to FIG. 8, the first circuit member 40 of the present embodiment has a first base portion 42 and a first conductive pattern 44. The first base portion 42 of the present embodiment is a thin, rectangular sheet formed of an insulation film and is bendable. The first base portion 42 extends in parallel to a horizontal plane (sheet plane: XY-plane) perpendicular to the Z-direction. The first conductive pattern 44 is formed on the first base portion 42. In detail, the first conductive pattern 44 is made of conductor such as copper and is formed on a lower surface (negative Z-side surface) of the first base portion 42 by a forming method such as silver ink printing or etching.

The second circuit member 50 of the present embodiment has a second base portion 52 and a second conductive pattern 54. The second base portion 52 of the present embodiment is a thin, rectangular sheet formed of an insulation film and is bendable. The second base portion 52 extends in parallel to the XY-plane. The second conductive pattern 54 is formed on the second base portion 52. In detail, the second conductive pattern 54 is made of conductor such as copper and is formed on an upper surface (positive Z-side surface) of the second base portion 52 by a forming method such as silver ink printing or etching.

Each of the first circuit member 40 and the second circuit member 50 of the present embodiment has the aforementioned structure. However, the present invention is not limited thereto. For example, each of the first circuit member 40 and the second circuit member 50 may be provided with one or more electronic components. One of the first circuit member 40 and the second circuit member 50 may be a single electronic component. Moreover, the shape of each of the first base portion 42 and the second base portion 52 is not limited to be rectangular but can be modified as necessary. Each of the first base portion 42 and the second base portion 52 may be a rigid circuit board which has rigidity and is hardly bent. The forming method of each of the first conductive pattern 44 and the second conductive pattern 54 is not specifically limited, provided that each of the first conductive pattern 44 and the second conductive pattern 54 is made of conductor.

Figure 4:
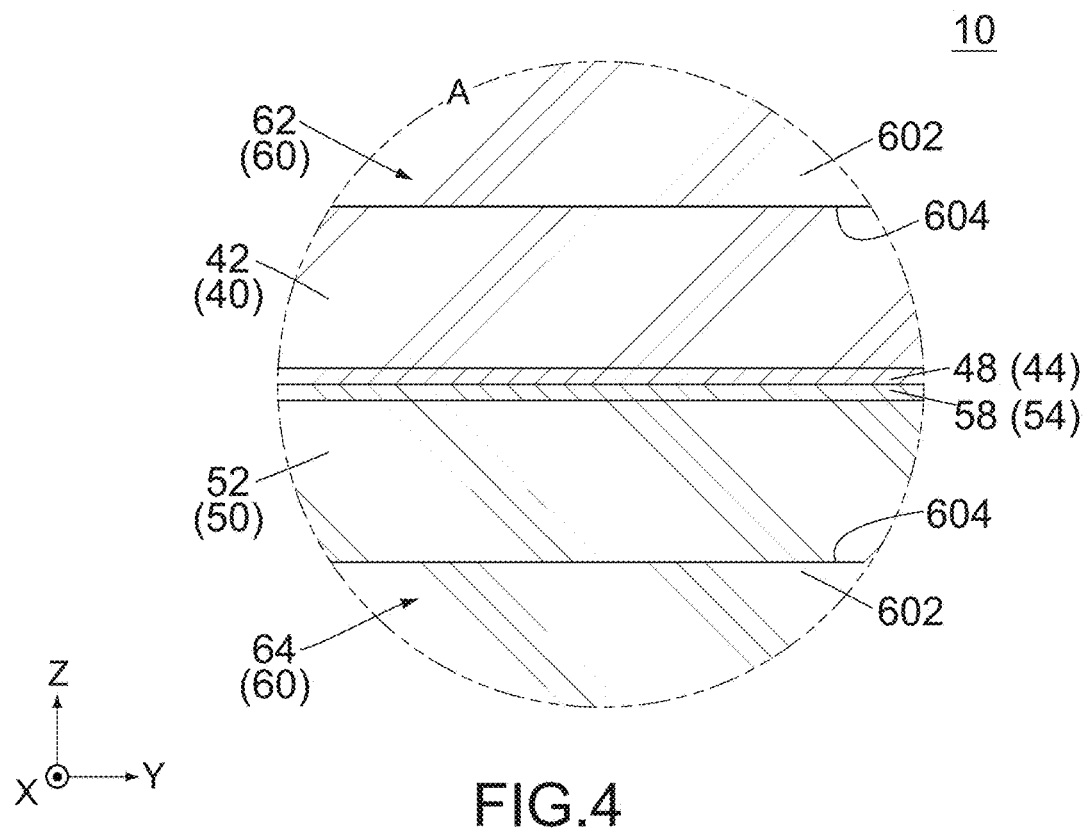
FIG. 4 is an enlarged, cross-sectional view showing a part of the device enclosed by two-dot chain line A in the enlarged view of FIG. 3.

In the present embodiment, the first conductive pattern 44 has a first contact point 48, and the second conductive pattern 54 has a second contact point 58. Thus, the first circuit member 40 comprises the first contact point 48, and the second circuit member 50 comprises the second contact point 58. Referring to FIGS. 3 and 4, in the fabricated device 10 (see FIG. 1), the first contact point 48 and the second contact point 58 are in contact with each other. Thus, the first circuit member 40 and the second circuit member 50 are combined to each other so that the first contact point 48 and the second contact point 58 are brought into contact with each other. The first circuit member 40 and the second circuit member 50 combined as described above form the circuit structure 12. The first conductive pattern 44 and the second conductive pattern 54 of the circuit structure 12 are electrically connected with each other.

The first conductive pattern 44 and the second conductive pattern 54 illustrated in FIG. 8 are abstract conductive patterns for simple explanation about the present invention and have no specific function. In other words, even when the illustrated first contact point 48 and the illustrated second contact point 58 are brought into contact with each other, the device 10 (see FIG. 1) does not work as an electronic device. The actual first conductive pattern 44 and the actual second conductive pattern 54 have the structure illustrated in FIGS. 5 and 6, for example.

Figure 6:
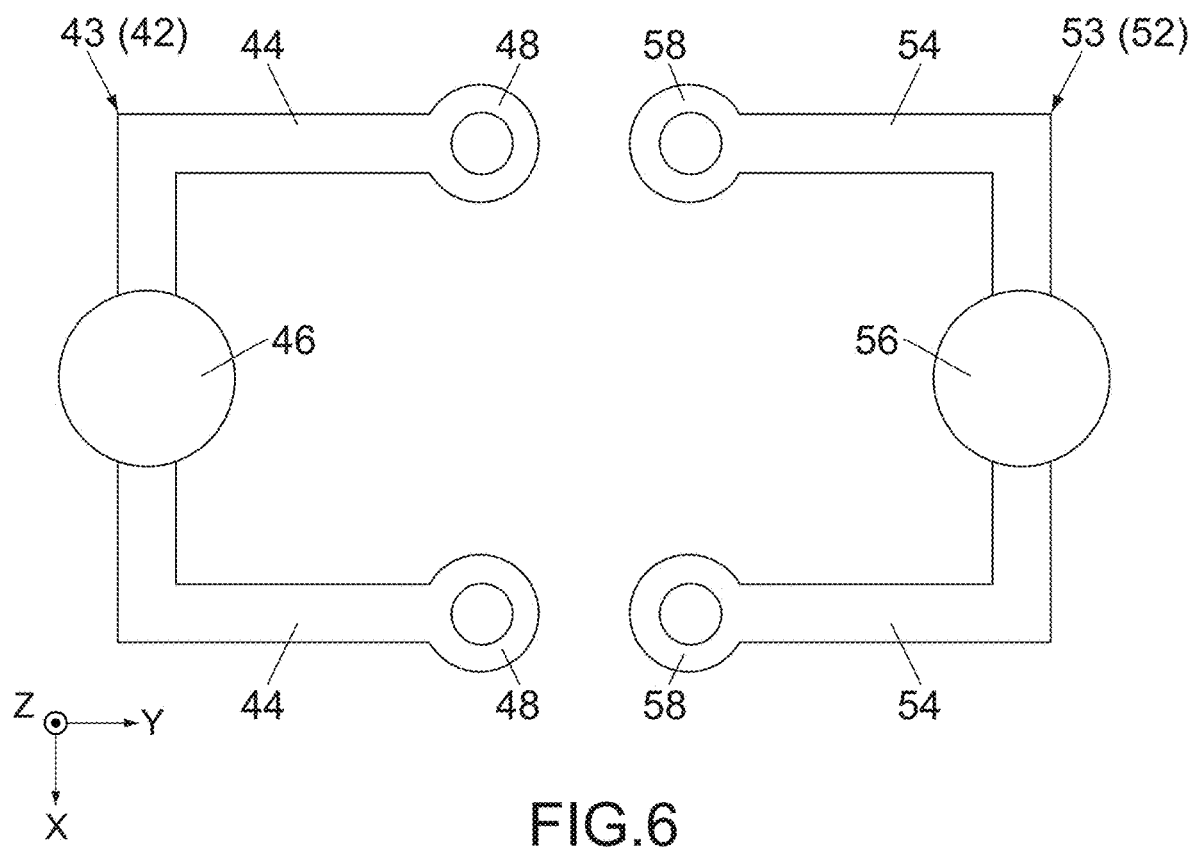
FIG. 6 is a view schematically showing a first conductive pattern of a first circuit member and a second conductive pattern of a second circuit member of the device of FIG. 5, wherein although first contact points of illustrated first circuit are apart from second contact points of illustrated second circuit, the actual first contact points are located on the second contact points, respectively.

Referring to FIGS. 5 and 6, the first base portion 42 has a first circuit 43 formed on a lower surface thereof, and the second base portion 52 has a second circuit 53 formed on an upper surface thereof. The first circuit 43 has a coin battery 46 and two of the first conductive patterns 44 which are formed with the first contact points 48, respectively. The second circuit 53 has a light emitting diode (LED) 56 and two of the second conductive patterns 54 which are formed with the second contact points 58, respectively. When the first contact points 48 are brought into contact with the second contact points 58, respectively, the coin battery 46 supplies electric power to the LED 56, and the LED 56 emits light. The structure of the first circuit 43 and the second circuit 53 can be modified to a more practical structure than that of the example of FIGS. 5 and 6. For example, the second circuit 53 may have, instead of the LED 56, a circuit for measuring heart rate and another circuit for transmitting the measurement results.

According to the example of FIGS. 5 and 6, each of the number of the first contact points 48 and the number of the second contact points 58 is two. However, each of the number of the first contact points 48 and the number of the second contact points 58 may be one as shown in FIG. 8 or may be three or more. Thus, the first circuit member 40 should have one or more of the first contact points 48, and the second circuit member 50 should have one or more of the second contact points 58 which correspond to the first contact points 48, respectively. In the fabricated device 10, each of the first contact points 48 should be in contact with the corresponding second contact point 58.

Referring to FIGS. 1 to 3, the first seal member 20 and the second seal member 30 of the present embodiment have structures similar to each other. More specifically, each of the first seal member 20 and the second seal member 30 is a thin, rectangular sheet formed of a film and is bendable. Each of the first seal member 20 and the second seal member 30 extends in parallel to the XY-plane. The first seal member 20 has a peripheral edge 29 in the XY-plane. The second seal member 30 has a peripheral edge 39 in the XY-plane.

The first seal member 20 and the second seal member 30 of the present embodiment overlap with each other so that the position of the peripheral edge 29 and the position of the peripheral edge 39 are aligned with each other in the XY-plane. However, the present invention is not limited thereto. For example, the size of the first seal member 20 in the XY-plane and the size of the second seal member 30 in the XY-plane may be different from each other. The shape of each of the first seal member 20 and the second seal member 30 is not limited to be rectangular but can be modified as necessary.

Referring to FIGS. 1 and 3, the first seal member 20 has a first inner portion 22 and a first outer portion 24. The first inner portion 22 is located inward of the first outer portion 24 in the XY-plane. In other words, the first outer portion 24 is a part of the first seal member 20 which surrounds the first inner portion 22. The second seal member 30 has a second inner portion 32 and a second outer portion 34. The second inner portion 32 is located inward of the second outer portion 34 in the XY-plane. In other words, the second outer portion 34 is a part of the second seal member 30 which surrounds the second inner portion 32.

Referring to FIG. 3, the first inner portion 22 of the first seal member 20 and the second inner portion 32 of the second seal member 30 of the device 10 are parts for accommodating the circuit structure 12 and the compressive members 60. Referring to FIG. 3 together with FIG. 8, before the device 10 of the present embodiment is formed, the first seal member 20 extends uniformly along the XY-plane, and there is no visible boundary between the first inner portion 22 and the first outer portion 24. Before the device 10 is formed, the second seal member 30 extends uniformly along the XY-plane, and there is no visible boundary between the second inner portion 32 and the second outer portion 34. However, the present invention is not limited thereto. For example, a visible boundary such as a depression may be formed between the first inner portion 22 and the first outer portion 24, and a visible boundary such as a depression may be formed between the second inner portion 32 and the second outer portion 34.

Referring to FIGS. 1 and 3, the first outer portion 24 of the present embodiment has a first seal portion 26 and a first contact portion 28. The second outer portion 34 of the present embodiment has a second seal portion 36 and a second contact portion 38. The first seal portion 26 and the second seal portion 36 are bonded together to form a seal trace 16.

According to the present embodiment, the first seal portion 26 and the second seal portion 36 are bonded together by heat-sealing. Thus, the seal trace 16 of the present embodiment is a trace where the first seal portion 26 and the second seal portion 36 are welded to each other by heating. However, the present invention is not limited thereto, but the first seal portion 26 and the second seal portion 36 can be bonded together by various methods such as high frequency, ultrasonic, laser or adhesion. For example, the first seal portion 26 and the second seal portion 36 may be bonded together with an adhesive. In this instance, the seal trace 16 is an adhesive trace. In this instance, the second seal member 30 may be a relatively thick member having rigidity.

The seal trace 16 of the present embodiment is formed throughout entire circumference of the first seal portion 26 and the second seal portion 36. In other words, the seal trace 16 surrounds the first inner portion 22 and the second inner portion 32 throughout their entire circumference in the XY-plane. Meanwhile, a part of the first seal portion 26 and a part of the second seal portion 36, in particular, outer circumferences of the first seal portion 26 and the second seal portion 36 in the XY-plane, are not heat-sealed and thereby are not formed with the seal trace 16. However, the present invention is not limited thereto, but the seal trace 16 may be formed all over the first seal portion 26 and the second seal portion 36.

Referring to FIG. 8, each of the compressive members 60 is a foaming, cushioning material having elasticity. More specifically, each of the compressive members 60 of the present embodiment is an open-cell structure such as a urethane sponge, a polyolefin sponge or a chloroprene rubber (CR) sponge. The open-cell structure of the present embodiment is formed of an expansible and compressible elastic body and a large number of cells which are densely formed in the elastic body. The cells are connected to each other to form open cells. The open cells open outward from the elastic body. When the open-cell structure is compressed, the open-cell structure shrinks while the air in the cells is discharged. When the compressing of the open-cell structure is stopped, the open-cell structure expands to restore its shape before the compressing while the outside air is absorbed into the cells. Each of the compressive members 60 of the present embodiment is an excellent cushioning material made of such open-cell structure.

In detail, each of the compressive members 60 of the present embodiment has a body 602 and two main surfaces 604. Two of the main surfaces 604 of each of the compressive members 60 are located opposite to each other in a predetermined direction, or in the Z-direction in FIG. 8, across the body 602 and extend in parallel to each other along a plane perpendicular to the predetermined direction, or along the XY-plane in FIG. 8. For each of the compressive members 60, when the body 602 is compressed so that two of the main surfaces 604 are close to each other in the predetermined direction, a part of the air contained in the body 602 is discharged, and when the compressing of the body 602 is stopped, air flows into the body 602.

Each of the compressive members 60 of the present embodiment has the aforementioned structure. However, the present invention is not limited thereto. For example, each of the compressive members 60 may be formed of two flat plates which are connected to each other by a large number of springs so as to work similarly to the open-cell structure.

Referring to FIG. 3 together with FIG. 8, when the device 10 of the present embodiment is formed, the first seal member 20 and the second seal member 30 are moved to be close to each other in the Z-direction and are bonded together while the compressive members 60 are compressed. As the compressive members 60 are compressed, the air contained in the compressive members 60 is discharged. When the first seal portion 26 and the second seal portion 36 are bonded together, the inside of the device 10 is shut off from the outside of the device 10. Each of the compressive members 60 absorbs the air remaining in the device 10, so that air pressure of the inside space of the device 10 is lowered. The first contact portion 28 and the second contact portion 38 are brought into contact with each other in a contact region 17 because of difference between the air pressure of the inside space and the air pressure of the outside of the device 10. As a result, the device 10 is formed with a closed space 18 which is enclosed by the first inner portion 22 and the second inner portion 32.

Referring to FIGS. 1 and 3, the first seal portion 26 of the first seal member 20 and the second seal portion 36 of the second seal member 30 are parts for securely bonding the first seal member 20 and the second seal member 30 together by sealing such as heat-sealing. The first contact portion 28 of the first seal member 20 and the second contact portion 38 of the second seal member 30 are parts which are brought into contact with each other in accordance with the bonding of the first seal portion 26 and the second seal portion 36 under a low pressure. According to the present embodiment, there is no visible boundary between the first seal portion 26 and the first contact portion 28 before the sealing. Similarly, there is no visible boundary between the second seal portion 36 and the second contact portion 38 before the sealing. However, the present invention is not limited thereto. For example, a visible boundary such as a depression may be formed between the first seal portion 26 and the first contact portion 28, and a visible boundary such as a depression may be formed between the second seal portion 36 and the second contact portion 38.

According to the present embodiment, the first seal portion 26 and the second seal portion 36 are bonded together under a state where the air pressure in the closed space 18 is set to a low pressure lower than the atmospheric pressure. In addition, the contact region 17 seamlessly surrounds the first inner portion 22 and the second inner portion 32 throughout their entire circumference in the XY-plane and thereby blocks the air which might flow between the inside and the outside of the closed space 18. Thus, the air pressure in the closed space 18 is kept to a low pressure lower than the atmospheric pressure not only by the first seal portion 26 and the second seal portion 36 which are bonded together but also by the first contact portion 28 and the second contact portion 38 which are in secure contact with each other. However, the present invention is not limited thereto. For example, the contact region 17 may partially surround the first inner portion 22 and the second inner portion 32 in the XY-plane.

Referring to FIG. 3, the compressive members 60 are shut in the closed space 18 which is kept to have the aforementioned low pressure. The first compressive member 62 is located between the first seal member 20 and the first circuit member 40 in the Z-direction. The second compressive member 64 is located between the second seal member 30 and the second circuit member 50 in the Z-direction.

Referring to FIG. 3, the first circuit member 40 and the second circuit member 50 are shut in the closed space 18 which is kept to have the aforementioned low pressure together with the compressive members 60. When the device 10 is formed, the first seal member 20 presses the first compressive member 62 against the first circuit member 40, and the second seal member 30 presses the second compressive member 64 against the second circuit member 50. Referring to FIGS. 3 and 8, each of the thus-pressed compressive members 60 is compressed mainly in the predetermined direction (Z-direction) while the air in the body 602 is discharged. Thus, in each of the compressive members 60 of the fabricated device 10, a part of the air contained in the body 602 is discharged. Therefore, the thickness, or a size in the Z-direction, of each of the compressive members 60 of the device 10 is extremely thinner than the compressive member 60 before the compressing.

Referring to FIGS. 3 and 4, the first contact point 48 and the second contact point 58 are in contact with each other in the closed space 18. In detail, the compressive members 60 which are shut in the closed space 18 absorb the small amount of air remaining in the device 10. As a result, the air pressure of the closed space 18 is lowered. The first contact point 48 and the second contact point 58 are pressed against each other because of the air pressure difference between the inside and the outside of the closed space 18. In addition, the first contact point 48 is pressed against the second contact points 58 by the restoring force of the first compressive member 62, and the second contact points 58 is pressed against the first contact point 48 by the restoring force of the second compressive member 64. Thus, the first contact point 48 and the second contact point 58 are pressed against each other by the restoring forces of the compressive members 60. Therefore, the contact between the first contact point 48 and the second contact point 58 can be securely kept.

Summarizing the explanation described above, the first seal member 20 and the second seal member 30 of the device 10 of the present embodiment overlap with each other to be in contact with each other while the first circuit member 40, the second circuit member 50 (hereafter, simply referred to as "circuit members") and the compressive members 60 are sandwiched therebetween. Each of the first seal member 20 and the second seal member 30 is formed of a thin film. The compressive members 60 can be compressed to be thinner. The structure of each of the circuit members is not restricted except that each of the circuit members should be provided with the contact point such as the first contact point 48 or the second contact point 58. Thus, each of the circuit members of the present embodiment has a simple structure and can be formed of various material. For example, each of the circuit members may be an insulation film formed with a conductive pattern having a contact point, such as the first conductive pattern 44 or the second conductive pattern 54. In this instance, the thickness of the whole device 10 can be made extremely thin. Thus, the present embodiment provides the device 10 which is new and can be made thinner.

The compressive members 60 of the present embodiment includes both of the first compressive member 62 and the second compressive member 64. Since the first compressive member 62 and the second compressive member 64 of the present embodiment are arranged so that the first contact point 48 and the second contact point 58 are sandwiched therebetween, the first contact point 48 and the second contact point 58 can be further stably connected to each other. However, the present invention is not limited thereto. For example, the compressive members 60 may include only one of the first compressive member 62 and the second compressive member 64. Instead, each of the number of the first compressive members 62 and the number of the second compressive members 64 may be two or more. Thus, the device 10 should comprise one or more of the compressive members 60. The compressive members 60 may include at least one of the first compressive member 62 and the second compressive member 64.

Referring to FIGS. 3 and 8, the first compressive member 62 of the present embodiment entirely covers the first circuit member 40 except for an end of the first circuit member 40. The second compressive member 64 of the present embodiment entirely covers the second circuit member 50 except for an end of the second circuit member 50. Thus, each of the compressive members 60 has a size (area) in the XY-plane extremely larger than that of each of the first contact point 48 and the second contact point 58. The compressive members 60 each having a large size as described above can be easily arranged so as to correspond to the first contact point 48 and the second contact point 58, respectively.

Each of the compressive members 60 before the compressing not only has a large size in the XY-plane but also has a large size in the Z-direction. In other words, each of the compressive members 60 of the present embodiment before the compressing has a large volume. When air flows into the closed space 18 of the device 10 in use, the air is absorbed into the compressive members 60, so that the restoring forces of the compressive members 60 are lowered. However, since each of the compressive members 60 of the present embodiment is large, change in the restoring force can be reduced.

However, the present invention is not limited thereto. For example, the size and the shape of each of the compressive members 60 are not specifically limited, provided that the compressive members 60 can be shut in the closed space 18 so that the first contact point 48 and the second contact point 58 are pressed against each other. For example, the first compressive member 62 may be located only between the first seal member 20 and the first contact point 48. The second compressive member 64 may be located only between the second seal member 30 and the second contact point 58. Thus, the first compressive member 62 should be, at least in part, located between the first seal member 20 and the first contact point 48. The second compressive member 64 should be, at least in part, located between the second seal member 30 and the second contact point 58.

Since the device 10 of the present embodiment comprises the compressive members 60, a contact force is generated between the first contact point 48 and the second contact point 58 of the fabricated device 10 because of the restoring forces of the compressive members 60. The contact force between the first contact point 48 and the second contact point 58 can be stably kept for a long time. Moreover, the compressive members 60 work as cushioning material, and thereby the device 10 is hardly damaged even when being bent. The present embodiment provides the device 10 which can stably work for a long time under various environments.

Referring to FIGS. 1 and 3, the first contact portion 28 and the second contact portion 38 of the present embodiment seamlessly surround the first inner portion 22 and the second inner portion 32 throughout their entire circumference in the XY-plane. The first seal portion 26 and the second seal portion 36 seamlessly surround the first contact portion 28 and the second contact portion 38 throughout their entire circumference in the XY-plane. According to this structure, the closed space 18 can be reliably kept airtight. Moreover, the first circuit member 40 and the second circuit member 50 can be easily taken out from the closed space 18 by cutting off the first seal portion 26 and the second seal portion 36. Thus, according to the present embodiment, the members can be easily collected separately and can be reused. However, the present invention is not limited thereto. For example, the first seal portion 26 and the second seal portion 36 may partially surround the first contact portion 28 and the second contact portion 38 in the XY-plane. The first seal portion 26 and the second seal portion 36 may be partially formed or may not be formed.

Figure 11:
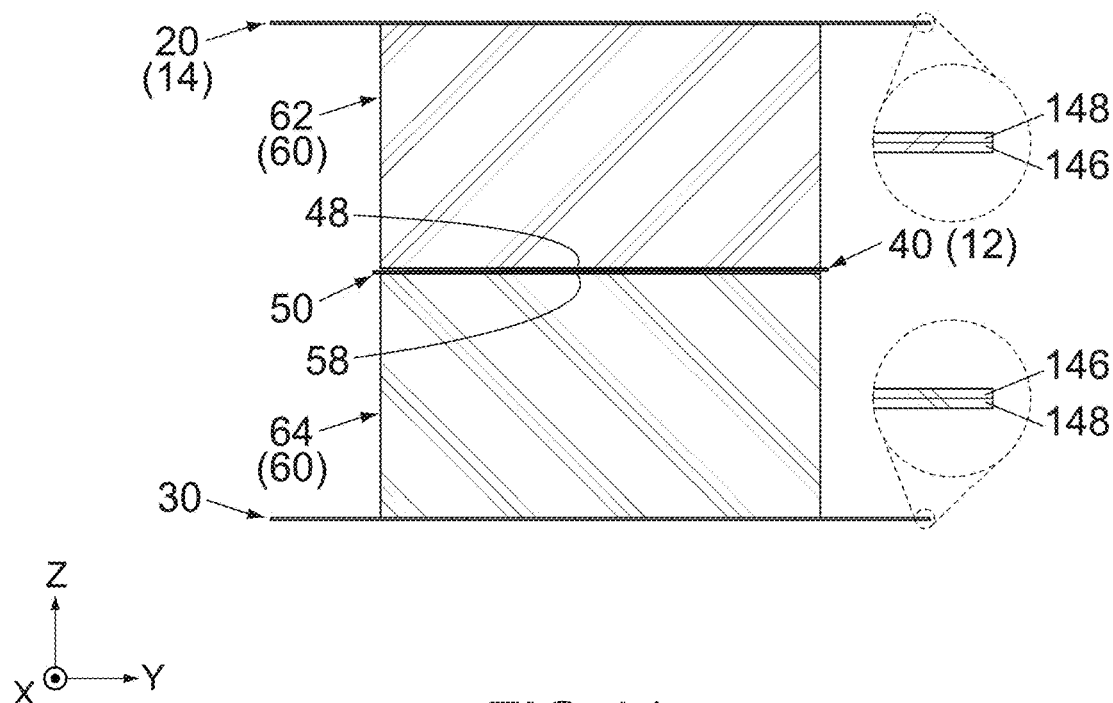
FIG. 11 is a cross-sectional view showing the device material set of FIG. 10, taken along line XI-XI, wherein two parts of the device material set each enclosed by dashed line are enlarged and illustrated.

Referring to FIGS. 1 and 11, each of the first seal member 20 and the second seal member 30 of the present embodiment includes two layers consisting of a meltable layer 146 which is meltable by the heat-sealing and an unmeltable layer 148 which is not meltable by the heat-sealing. In other words, each of the first seal member 20 and the second seal member 30 has a two-layer structure formed of the meltable layer 146 and the unmeltable layer 148. For example, the meltable layer 146 is made of polyethylene, and the unmeltable layer 148 is made of nylon. According to this structure, the meltable layers 146 can be fused to each other while the unmeltable layers 148 of the first seal portion 26 and the second seal portion 36 are maintained. However, the present invention is not limited thereto, but each of the first seal member 20 and the second seal member 30 may have a structure in accordance with the sealing method. For example, each of the first seal member 20 and the second seal member 30 may include only one layer or may include three or more layers.

Each of the first seal member 20 and the second seal member 30 of the present embodiment is formed so that a part thereof, which is other than the first seal portion 26 and the second seal portion 36, also includes the meltable layer 146 and the unmeltable layer 148. However, the present invention is not limited thereto. For example, the meltable layer 146 may be formed only in each of the first seal portion 26 and the second seal portion 36.

Referring to FIG. 1, each of the first seal member 20 and the second seal member 30 is preferred to have a high barrier property against oxygen. More specifically, each of the first seal member 20 and the second seal member 30 is preferred to comprise a layer made of high oxygen barrier material which is material having a high barrier property against oxygen. According to this layer-structure, oxidation of the metal members of the circuit structure 12 can be reduced.

For example, the high oxygen barrier material may be linear low-density polyethylene (LLDPE). More specifically, the high oxygen barrier material may be PET/Al/PE which is formed by laminating polyethylene terephthalate, aluminum and polyethylene; ON/PE which is formed by laminating biaxially stretched nylon and polyethylene; PET/EVOH/PE which is formed by laminating polyethylene terephthalate, polyvinyl chloride and polyethylene; or may be formed by laminating a transparent high barrier film and polyethylene. The transparent high barrier film may be polyethylene terephthalate (PET) deposited with SiOx or aluminum oxide.

Each of the first seal member 20 and the second seal member 30 of the present embodiment is preferred to have a high barrier property against water vapor in addition to the high barrier property against oxygen. More specifically, each of the first seal member 20 and the second seal member 30 is preferred to comprise a layer made of high water-vapor barrier material which is material having a high barrier property against water vapor. According to this layer-structure, the circuit structure 12 can be water-proofed. For example, the high water-vapor barrier material may be material which is a sheet made of ON/PE, biaxially stretched polypropylene (OPP) or PET and is coated with polyvinylidene chloride (PVDC).

Each of the first seal member 20 and the second seal member 30 may have various barrier properties such as a barrier property against nitrogen in addition to the high barrier property against oxygen and the high barrier property against water vapor. Thus, each of the first seal member 20 and the second seal member 30 is preferred to have high barrier properties in accordance with its use.

Figure 7:
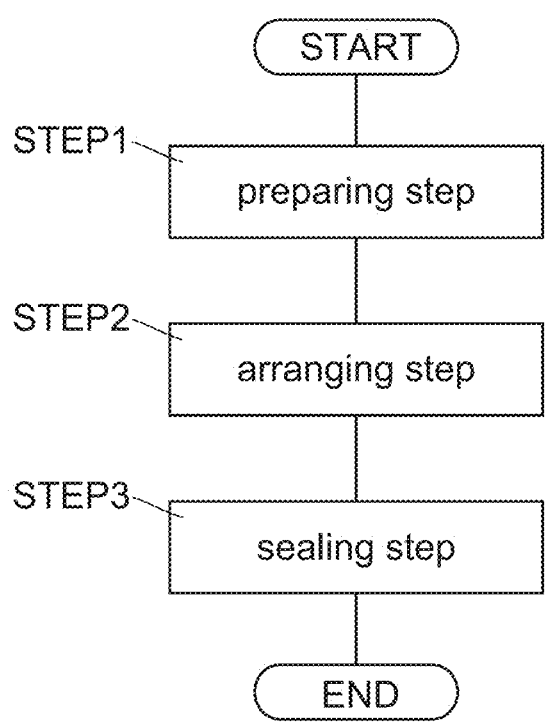
FIG. 7 is a flowchart showing an example of a forming method for forming the device of FIG. 1.

Referring to FIG. 7, the device 10 (see FIG. 1) of the present embodiment is formed via three steps consisting of a preparing step (STEP 1), an arranging step (STEP 2) and a sealing step (STEP 3). However, the present invention is not limited thereto, but the forming method of the device 10 can be modified as necessary. Hereafter, explanation will be made about the forming method of the device 10 of the present embodiment.

Referring to FIG. 8, in the preparing step (see FIG. 6), a device material set 11 is prepared. The device material set 11 comprises the first seal member 20, the second seal member 30, the first circuit member 40, the second circuit member 50 and the compressive members 60. Each member has the structure which is already explained and can be variously modified as already explained.

Thus, the forming method of the present embodiment comprises preparing the first seal member 20, the second seal member 30, the first circuit member 40, the second circuit member 50 and the compressive members 60, the first seal member 20 being formed of a film, the first circuit member 40 comprising the first contact point 48, the second circuit member 50 comprising the second contact point 58, the compressive members 60 including at least one of the first compressive member 62 and the second compressive member 64, each of the compressive members 60 having the body 602 and two of the main surfaces 604, two of the main surfaces 604 of each of the compressive members 60 being located opposite to each other in the predetermined direction (Z-direction in FIG. 8) across the body 602, wherein for each of the compressive members 60, when the body 602 is compressed so that two of the main surfaces 604 are close to each other in the predetermined direction, a part of air contained in the body 602 is discharged, and when the compressing of the body 602 is stopped, air flows into the body 602.

Figure 9:
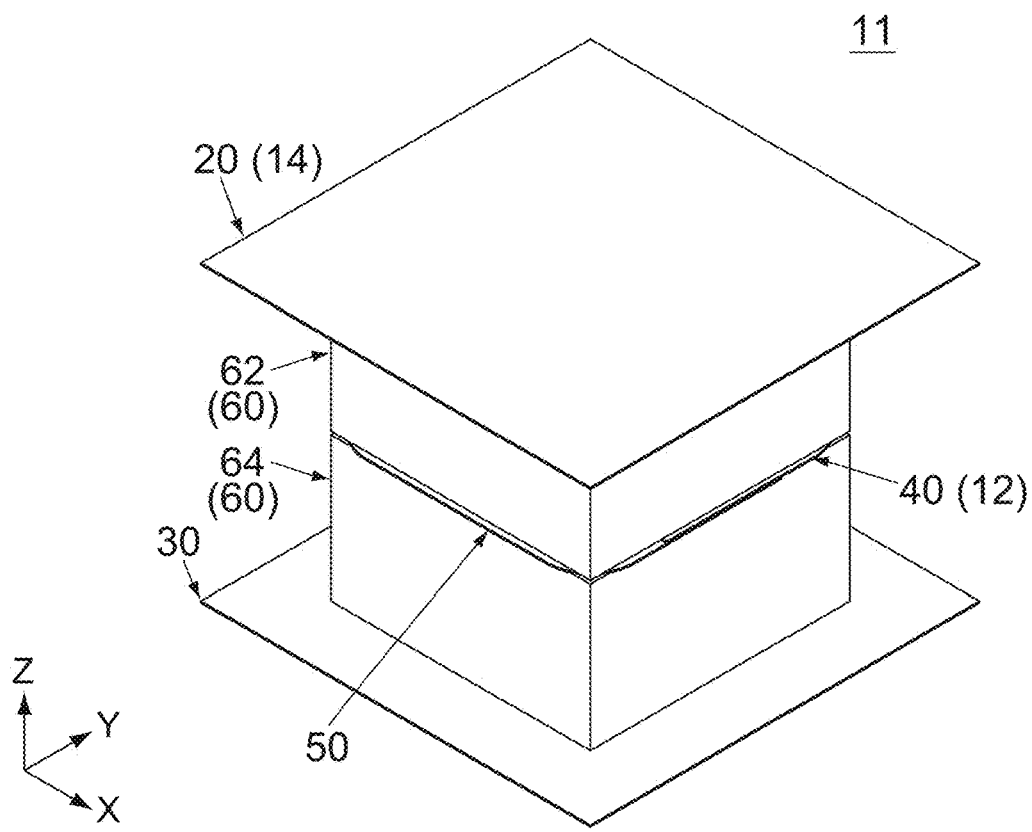
FIG. 9 is a perspective view showing the device material set of FIG. 8 which is arranged in an arranging step of the forming method of FIG. 7.
Figure 10:
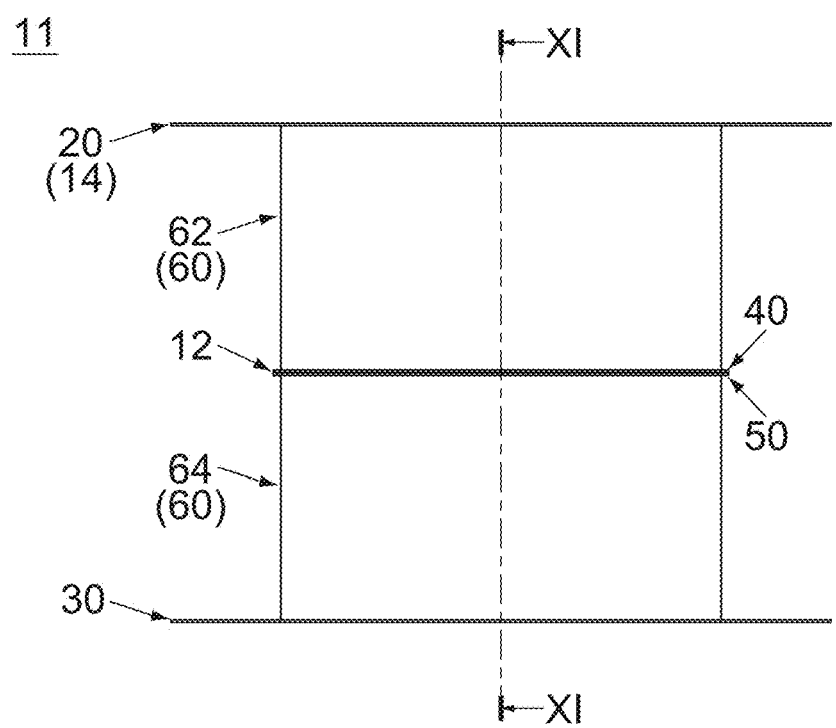
FIG. 10 is a side view showing the device material set of FIG. 9.

Then, referring to FIGS. 9 to 11, in the arranging step (see FIG. 7), the first seal member 20, the first circuit member 40, the second circuit member 50 and the second seal member 30 are stacked on each other in this order from top to bottom along the Z-direction. Meanwhile, the first circuit member 40 and the second circuit member 50 are located at the middle of the first seal member 20 and the second seal member 30 in the XY-plane. The first circuit member 40 and the second circuit member 50 are arranged so that the first contact point 48 and the second contact point 58 face each other in the Z-direction. The first compressive member 62 and the second compressive member 64 are arranged so as to vertically sandwich the first contact point 48 of the first circuit member 40 and the second contact points 58 of the second circuit member 50 therebetween. In addition, the first seal member 20 and the second seal member 30 are arranged so that two of the meltable layers 146 thereof face each other in the Z-direction.

Then, referring to FIGS. 9 to 12, the device material set 11 which is arranged as described above is accommodated in an assembly machine 70. Thus, the forming method of the present embodiment comprises arranging the first seal member 20, the first circuit member 40, the second circuit member 50 and the second seal member 30, which are stacked in this order, in the assembly machine 70 while the first contact point 48 and the second contact point 58 face each other, the first compressive member 62 being, at least in part, located between the first seal member 20 and the first contact point 48, the second compressive member 64 being, at least in part, located between the second seal member 30 and the second contact point 58.

Figure 12:
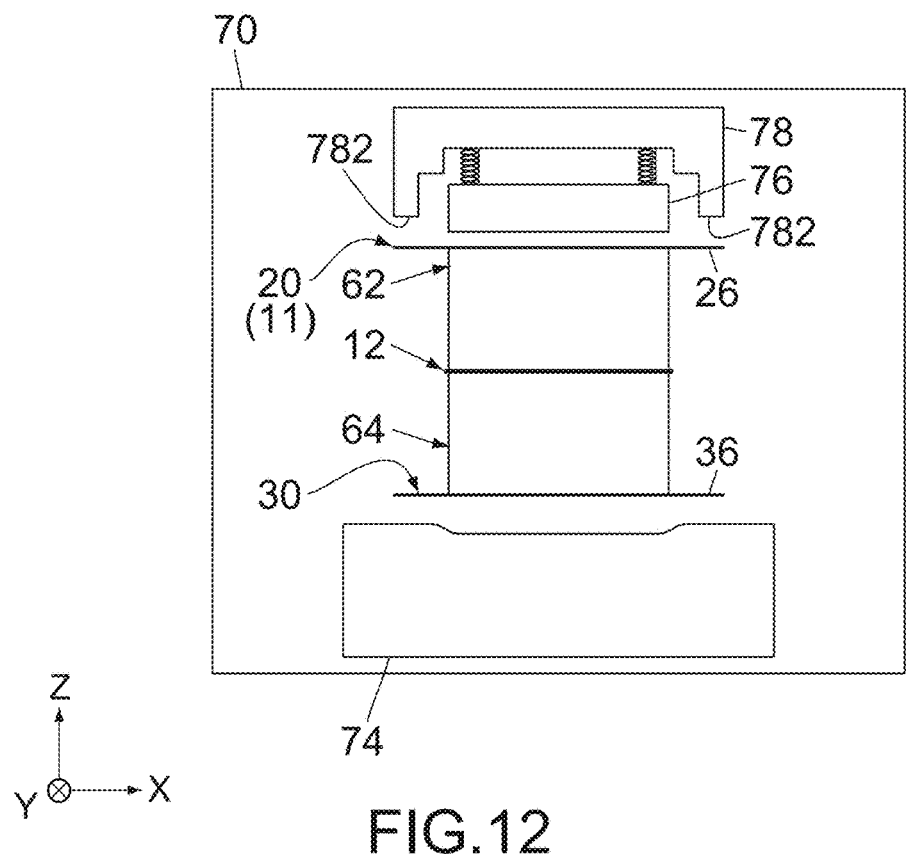
FIG. 12 is a view showing a schematic structure of an assembly machine and the device material set of FIG. 10 which is arranged in the assembly machine in an arranging step of the forming method of FIG. 7.

Referring to FIG. 12, the assembly machine 70 of the present embodiment comprises a die 74, a pressing portion 76 and a heat-seal bar 78. The device material set 11 is placed on the die 74. Thereafter, the pressing portion 76 of the assembly machine 70 is moved downward together with the heat-seal bar 78 and is pressed toward the die 74 while the device material set 11 is pressed. Each of the compressive members 60 is compressed mainly in the Z-direction by the pressing of the pressing portion 76 while air contained therein is discharged. When each of the compressive members 60 is sufficiently compressed, the first seal member 20 and the second seal member 30 are sealed by the heat-seal bar 78.

In detail, the heat-seal bar 78 of the present embodiment has a heating portion 782. According to the present embodiment, the heating portion 782 is heated so as to have a temperature higher than the melting point of the meltable layer 146 (see FIG. 11). The thus-heated heating portion 782 is pressed against the first seal portion 26 of the first seal member 20 and the second seal portion 36 of the second seal member 30 which vertically overlap with each other so that the first seal portion 26 and the second seal portion 36 are heat-sealed.

As a result of the heat-sealing, the first circuit member 40, the second circuit member 50 and the compressive members 60 are shut in the closed space 18 (see FIG. 3) which is enclosed by the first seal member 20 and the second seal member 30. When the pressing of the pressing portion 76 is stopped after the heat-sealing, the compressive members 60 absorb air in the closed space 18 so as to return to their initial shapes. The compressive members 60, which absorb the air, expand, so that the volume of the closed space 18 increases and the air pressure of the closed space 18 is lowered. As a result, air pressure difference is generated between the inside and the outside of the closed space 18, and a compressing force which compresses the compressive members 60 is generated. The expansion of the compressive members 60 ends when this compressing force is balanced with the restoring force of the compressive members 60.

When the expansion of the compressive members 60 ends, the compressive members 60 do not yet return to their initial shapes and have the restoring forces. The first contact point 48 and the second contact point 58 are pressed against each other by the restoring forces of the compressive members 60 which are generated because of the air pressure difference between the inside and the outside of the closed space 18 (see FIG. 3). As a result, the first contact point 48 and the second contact point 58 are brought into secure contact with each other.

Thus, the forming method of the present embodiment comprises sealing the first seal member 20 and the second seal member 30 which are in contact with each other while the compressive members 60 are compressed, so that the first circuit member 40, the second circuit member 50 and the compressive members 60 are shut in the closed space 18 (see FIG. 3) enclosed by the first seal member 20 and the second seal member 30, and the first contact point 48 and the second contact point 58 are brought into contact with each other.

Referring to FIG. 3, according to the forming method of the present embodiment, the first contact point 48 and the second contact point 58 are in secure contact with each other while they are not fixed to each other via soldering, etc. Therefore, when the device 10 is no longer used, the device 10 can be disassembled merely by cutting off the first seal portion 26 and the second seal portion 36. In addition, the first circuit member 40 and the second circuit member 50 can be shut in the closed space 18 having a low pressure, so that degradation of the metal members due to oxidation can be reduced, for example. However, the present invention is not limited thereto, but the forming method and the sealing method of the device 10 can be modified as necessary.

Figure 13:
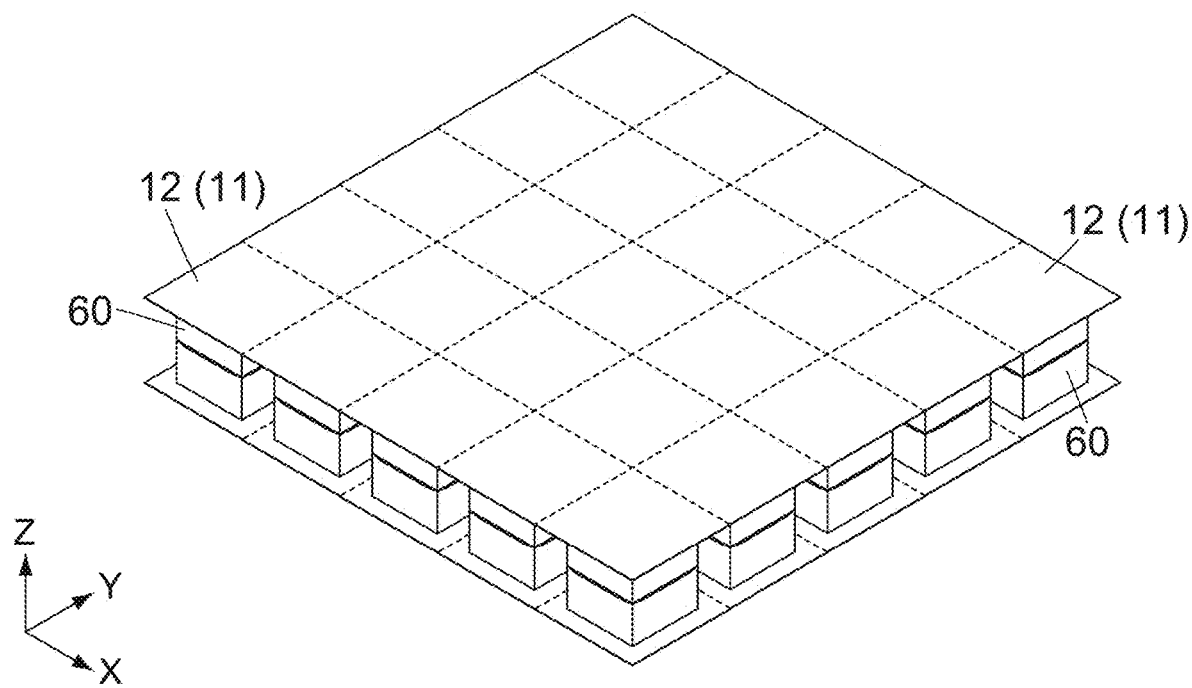
FIG. 13 is a view showing a member comprising a plurality of the device material sets of FIG. 9, wherein boundary lines between every one of the device material sets and the others are illustrated with dashed line.

Referring to FIGS. 7 to 12, according to the aforementioned forming method, one of the device 10 (see FIG. 1) is formed from one of the device material set 11 via the steps from the preparing step to the sealing step. However, the present invention is not limited thereto. For example, referring to FIG. 13, a member comprising a plurality of the device material sets 11 may be prepared and arranged. The sealing step (see FIGS. 7 and 12) may be performed to this whole member. Moreover, the member illustrated in FIG. 13 may be moved into the assembly machine 70 (see FIG. 12) by a device such as a roller.

The present embodiment can be further variously modified in addition to the already described modifications. Hereafter, explanation will be made about five modifications.

Figure 14:
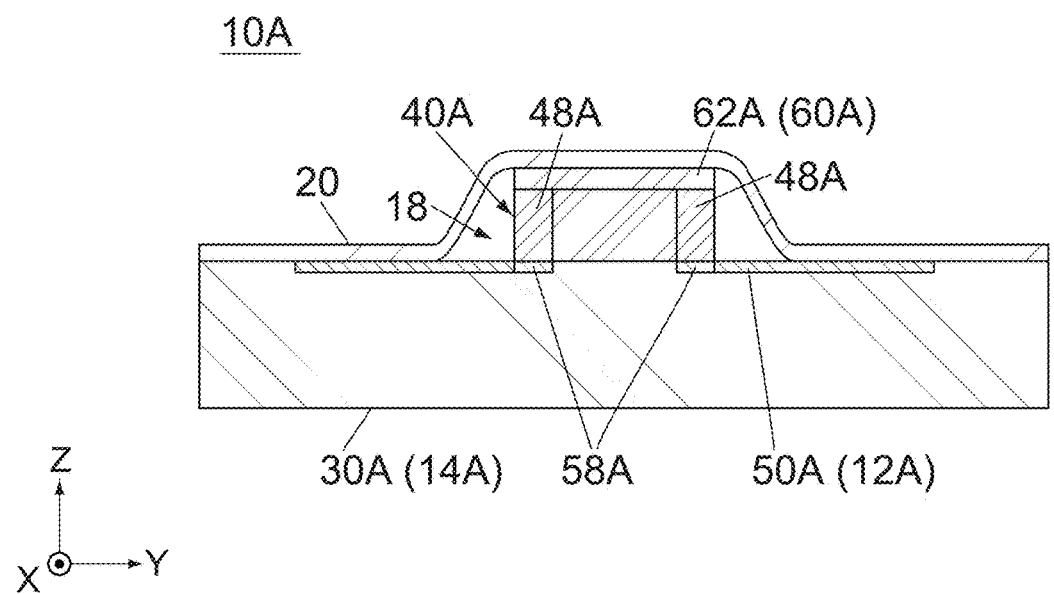
FIG. 14 is a cross-sectional view showing a modification of the device of FIG. 5.

Comparing FIG. 14 with FIG. 5, a device 10A according to a first modification of the present embodiment comprises a circuit structure 12A different from the circuit structure 12 of the device 10, a seal member 14A different from the seal member 14 of the device 10 and a compressive member 60A different from the compressive members 60 of the device 10. The seal member 14A accommodates the circuit structure 12A together with the compressive member 60A therewithin similarly to the seal member 14.

The seal member 14A of the present modification comprises a second seal member (board) 30A and the first seal member 20 which is same as that of the device 10 and is formed of a film. The second seal member 30A is a rigid circuit board. The circuit structure 12A of the present modification comprises a first circuit member 40A and a second circuit member 50A. The first circuit member 40A is a single electronic component and comprises two first contact points 48A. The second circuit member 50A is conductive patterns formed on the second seal member 30A and comprises two second contact points 58A. The first contact points 48A are in contact with the second contact points 58A, respectively, so that the conductive patterns formed on the second seal member 30A are electrically connected with each other. The compressive member 60A includes only one first compressive member 62A. The first compressive member 62A is an open-cell structure similar to the first compressive member 62.

As described above, the device 10A comprises the first seal member 20, the second seal member 30A, the first circuit member 40A, the second circuit member 50A and one of the compressive member 60A. The first seal member 20 and the second seal member 30A are sealed with an adhesive, for example. However, the present invention is not limited thereto. For example, the first seal member 20 and the second seal member 30A may be heat-sealed. In this instance, similarly to the first seal member 20, the second seal member 30A may comprise two layers consisting of a meltable layer (not shown) which is meltable by the heat-sealing and an unmeltable layer (not shown) which is not meltable by the heat-sealing. Moreover, similarly to the first seal member 20, the second seal member 30A may have high barrier properties such as a high barrier property against oxygen and a high barrier property against water vapor.

The device 10A is formed with the closed space 18 similar to that of the device 10. The first circuit member 40A and the second circuit member 50A are shut in the closed space 18 together with the compressive member 60A. The compressive member 60A is located between the first seal member 20 and the whole first circuit member 40A including the first contact points 48A and presses the first contact points 48A against the second contact points 58A, respectively. According to the present modification, each of the first contact points 48A and the corresponding second contact points 58A can be stably connected to each other while the first circuit member 40A is not fixed to the second circuit member 50A via soldering, etc.

Figure 15:
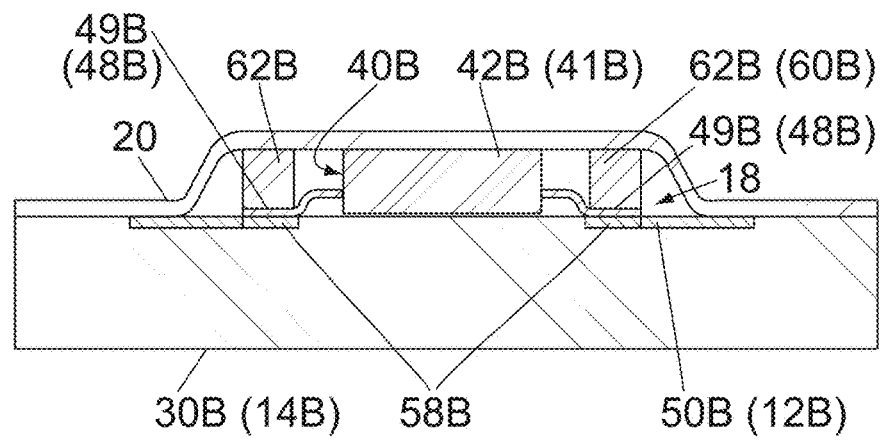
FIG. 15 is cross-sectional view showing another modification of the device of FIG. 5.

Comparing FIG. 15 with FIG. 5, a device 10B according to a second modification of the present embodiment comprises a circuit structure 12B different from the circuit structure 12A of the device 10A, a seal member 14B different from the seal member 14A of the device 10A and compressive members 60B different from the compressive member 60A of the device 10A. The seal member 14B accommodates the circuit structure 12B together with the compressive members 60B therewithin similarly to the seal member 14A.

The seal member 14B of the present modification comprises the first seal member 20, which is same as that of the device 10A and is formed of a film, and a second seal member (board) 30B which is a rigid circuit board similar to the second seal member 30A of the device 10A. The circuit structure 12B of the present modification comprises a first circuit member 40B and a second circuit member 50B. The first circuit member 40B is formed of a single electronic component 41B. The electronic component 41B comprises a main portion 42B and two terminals 49B. Each of the terminals 49B works as a first contact point 48B. The second circuit member 50B are conductive patterns formed on the second seal member 30B and comprises two second contact points 58B which correspond to the first contact points 48B, respectively. The compressive members 60B include only two first compressive members 62B which correspond to the first contact points 48B, respectively. Each of the first compressive members 62B is an open-cell structure similar to the first compressive member 62A.

As described above, the device 10B comprises the first seal member 20, the second seal member 30B, the first circuit member 40B, the second circuit member 50B and two of the compressive members 60B. The first seal member 20 and the second seal member 30B are sealed with an adhesive, for example. The device 10B is formed with the closed space 18 similar to that of the device 10A. The first circuit member 40B and the second circuit member 50B are shut in the closed space 18 together with two of the compressive members 60B. The first contact points 48B are in contact with the second contact points 58B, respectively.

Each of the compressive members 60B is located between the corresponding first contact points 48B and the first seal member 20 and presses the first contact point 48B of the terminal 49B against the second contact point 58B. Each of the terminals 49B is provided on a lower part of the main portion 42B and extends downward toward the corresponding second contact point 58B. Each of the compressive members 60B does not cover the main portion 42B but covers the corresponding terminal 49B.

According to the present modification, each of the first contact points 48B and the corresponding second contact point 58B can be stably connected to each other while the first circuit member 40B is not fixed to the second circuit member 50B via soldering, etc. similarly to the device 10A. Moreover, according to the present modification, a size of each of the compressive members 60B in the XY-plane can be made smaller than the whole first circuit member 40B.

The present modification can be further modified. For example, the number of the electronic components 41B may be two or more. The first circuit member 40B may be a rigid circuit board. In this instance, the second circuit member 50B may be the single electronic component 41B. Thus, at least one of the first circuit member 40B and the second circuit member 50B may include the electronic component 41B. Each of the terminals 49B of the electronic component 41B may work as one of the first contact point 48B and the second contact point 58B. Each of the terminals 49B of the electronic component 41B may extend from the main portion 42B toward a remaining one of the first contact point 48B and the second contact point 58B. One of the compressive members 60B may not cover the main portion 42B but may cover the terminal 49B.

Figure 16:
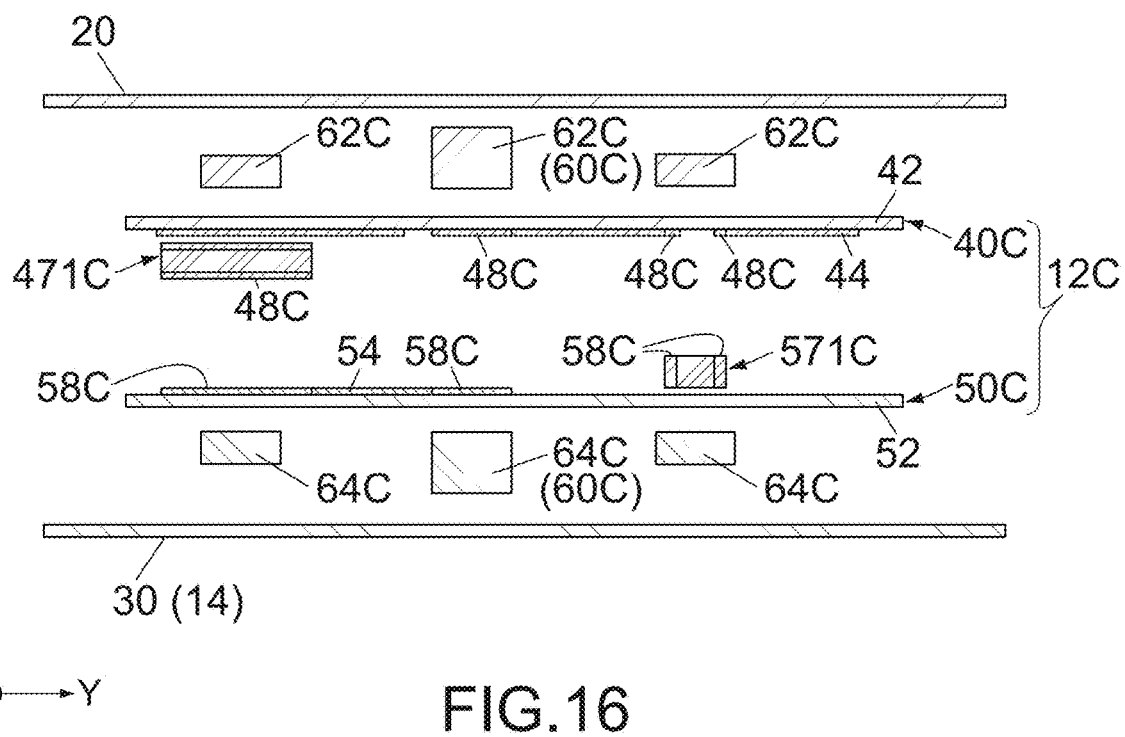
FIG. 16 is a cross-sectional view showing a device material set of a still another modification of the device of FIG. 5.

Comparing FIG. 16 with FIG. 10, a device material set 11C according to a third modification of the present embodiment comprises a circuit structure 12C different from the circuit structure 12 of the device material set 11, the seal member (film member) 14 same as that of the device material set 11 and compressive members 60C different from the compressive members 60 of the device material set 11. The film member 14 is heat-sealed similarly to the device 10 (see FIG. 1). A device (not shown) which is assembled from the device material set 11C is formed with the closed space 18 (see FIG. 3) similar to that of the device 10.

The circuit structure 12C of the present modification comprises a first circuit member 40C and a second circuit member 50C. The first circuit member 40C comprises the first base portion 42 similar to that of the first circuit member 40, the first conductive pattern 44 formed on the first base portion 42 and an electronic component 471C which is to be connected to the first conductive pattern 44. The second circuit member 50C comprises the second base portion 52 similar to that of the second circuit member 50, the second conductive pattern 54 formed on the second base portion 52 and an electronic component 571C which is to be connected to the second conductive pattern 54. The compressive members 60C comprise three first compressive members 62C and three second compressive members 64C. Each of the compressive members 60C is an open-cell structure similar to the compressive member 60.

The first circuit member 40C comprises four first contact points 48C. Three of the first contact points 48C are provided on the first conductive pattern 44. The other one of the first contact points 48C is provided on the electronic component 471C. The second circuit member 50C comprises four second contact points 58C which correspond to the first contact points 48C, respectively. Two of the second contact points 58C are provided on the second conductive pattern 54. The other two of the second contact points 58C are provided on the electronic component 571C.

As can be seen from FIG. 16, the device (not shown) formed of the device material set 110 comprises the first seal member 20, the second seal member 30, the first circuit member 40C, the second circuit member 50C and six of the compressive members 60C. The first circuit member 40C and the second circuit member 50C are shut in the closed space 18 (see FIG. 3) of the device together with six of the compressive members 60C. The first contact points 48C are in contact with the second contact points 58C, respectively. Each of the first compressive members 62C is located between the corresponding first contact point 48C and the first seal member 20 and presses the first contact point 48C against the corresponding second contact point 58C. Each of the second compressive members 64C is located between the corresponding second contact point 58C and the second seal member 30 and presses the second contact point 58C against the corresponding first contact point 48C.

According to the present modification, similarly to the device 10, the first contact points 48C can be stably connected to the second contact points 58C, respectively, while the first circuit member 40C including the electronic component 471C and the second circuit member 50C including the electronic component 571C are not applied with soldering, etc. Moreover, according to the present modification, a size of each of the compressive members 60C in the Z-direction can be adjusted in accordance with a distance between the first contact point 48C and the second contact point 58C. For example, the first contact point 48C of the first conductive pattern 44 and the second contact point 58C of the second conductive pattern 54 are far apart from each other in comparison with the other first contact points 48C and the other second contact points 58C. In this instance, the size of the corresponding compressive member 60C in the Z-direction may be made large so that the restoring force of the compressed compressive member 60C is made large. By the adjustment as described above, the first contact points 48C can be stably connected to the second contact points 58C, respectively, while a thickness of the whole device 10B is made uniform.

Figure 17:
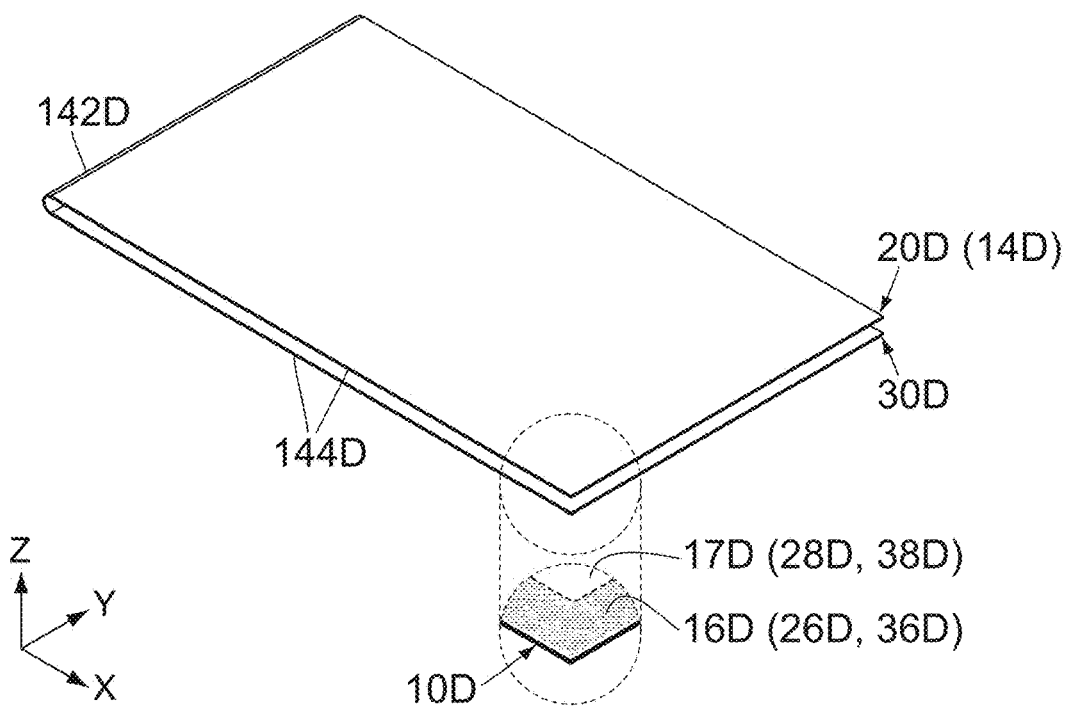
FIG. 17 is a perspective view showing a modification of a film member of the device material set of FIG. 8, wherein a structure of a fabricated device is shown for a part of the film member enclosed by dashed line.

Comparing FIG. 17 with FIG. 8, a device 10D according to a fourth modification of the present embodiment is formed from a device material set 11D. The device material set 11D comprises one film member (planar sheet) 14D made of insulator instead of the first seal member 20 and the second seal member 30 of the device material set 11. The device material set 11D also comprises the circuit structure 12 same as that of the device material set 11 and compressive members (not shown) each smaller than the compressive member 60 of the device material set 11.

The planar sheet 14D is bent at the middle thereof, namely a predetermined portion 142D, in a front-rear direction (X-direction) so as to form a first seal member (sheet piece) 20D and a second seal member (sheet piece) 30D which overlap with each other in the Z-direction. Thus, the first seal member 20D and the second seal member 30D are two sheet pieces of the single film member 14D which overlap with each other. The film member 14D is a single planar sheet. The film member 14D has the predetermined portion 142D and a cutting edge 144D. The cutting edge 144D is an edge of the film member 14D in the XY-plane.

The device 10D of the present modification can be formed by a forming method similar to that of the device 10 (see FIG. 1) so as to have a structure similar to that of the device 10. For example, in the arranging step (see FIG. 7), the circuit structure 12 and the compressive members are arranged between the first seal member 20D and the second seal member 30D in the Z-direction. A first seal portion 26D and a second seal portion 36D are bonded together to form a seal trace 16D. A first contact portion 28D and a second contact portion 38D are in contact with each other in a contact region 17D. The device 10D is formed with the closed space 18 (see FIG. 3) similar to that of the device 10. The first circuit member 40, the second circuit member 50 and the compressive members are shut in the closed space 18. The first contact point 48 of the first circuit member 40 and the second contact point 58 of the second circuit member 50 are pressed against each other by the compressive members to be in contact with each other.

However, the device 10D is different from the device 10 (see FIG. 1) in the following points. First, the first seal member 20D and the second seal member 30D are two of the sheet pieces which are folded at the predetermined portion 142D to overlap with each other. Thus, the first seal member 20D and the second seal member 30D are connected to each other at the predetermined portion 142D. According to this structure, there is no need to seal the part between the predetermined portion 142D and the contact region 17D. Accordingly, only the part between the contact region 17D and the cutting edge 144D is sealed. In other words, the seal trace 16D is formed only between the contact region 17D and the cutting edge 144D. However, the present invention is not limited thereto, but the part between the predetermined portion 142D and the contact region 17D may be sealed. Thus, the seal trace 16D should be formed at least between the contact region 17D and the cutting edge 144D.

Figure 18:
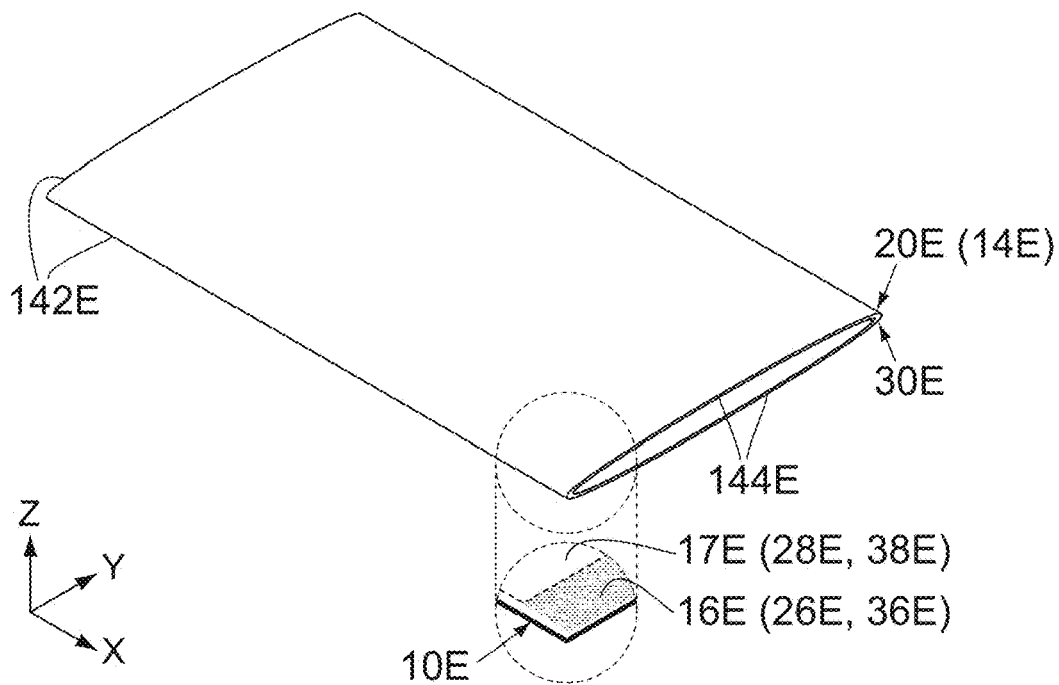
FIG. 18 is a perspective view showing another modification of the film member of the device material set of FIG. 8, wherein a structure of a fabricated device is shown for a part of the film member enclosed by dashed line.
Figure 19:
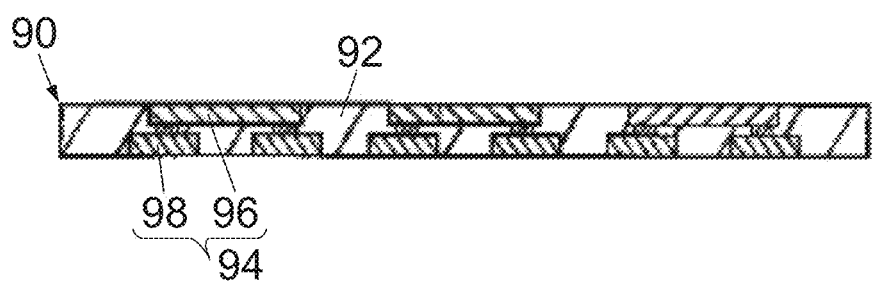
FIG. 19 is a cross-sectional view showing a device of Patent Document 1.

Comparing FIG. 18 with FIG. 8, a device 10E according to a fifth modification of the present embodiment is formed from a device material set 11E. The device material set 11E comprises one film member (folder-like sheet) 14E made of insulator instead of the first seal member 20 and the second seal member 30 of the device material set 11. The device material set 11E also comprises the circuit structure 12 same as that of the device material set 11 and compressive members (not shown) each smaller than the compressive member 60 of the device material set 11.

The folder-like sheet 14E has three connected sides, namely a predetermined portion 142E, in the XY-plane and opens at a front end (positive X-side end) thereof. According to this structure, the folder-like sheet 14E is formed with a first seal member (sheet piece) 20E and a second seal member (sheet piece) 30E which overlap with each other in the Z-direction. Thus, the first seal member 20E and the second seal member 30E are two sheet pieces of the single film member 14E which overlap with each other. The film member 14E is a single folder-like sheet. The film member 14E has the predetermined portion 142E and a cutting edge 144E. The cutting edge 144E is the edge of the opening of the film member 14E.

The device 10E of the present modification can be formed by a forming method similar to that of the device 10 (see FIG. 1) so as to have a structure similar to that of the device 10. For example, in the arranging step (see FIG. 7), the circuit structure 12 and the compressive members are put into the film member 14E and are arranged between the first seal member 20E and the second seal member 30E in the Z-direction. A first seal portion 26E and a second seal portion 36E are bonded together to form a seal trace 16E. A first contact portion 28E and a second contact portion 38E are in contact with each other in a contact region 17E. The device 10E is formed with the closed space 18 (see FIG. 3) similar to that of the device 10. The first circuit member 40, the second circuit member 50 and the compressive members are shut in the closed space 18. The first contact point 48 of the first circuit member 40 and the second contact point 58 of the second circuit member 50 are pressed against each other by the compressive members to be in contact with each other.

However, the device 10E is different from the device 10 (see FIG. 1) in the following points. First, the first seal member 20E and the second seal member 30E are two of the sheet pieces which are connected to each other at the predetermined portion 142E. Thus, the first seal member 20E and the second seal member 30E are connected to each other at the predetermined portion 142E. According to this structure, there is no need to seal the part between the predetermined portion 142E and the contact region 17E. Accordingly, only the part between the contact region 17E and the cutting edge 144E is sealed. In other words, the seal trace 16E is formed only between the contact region 17E and the cutting edge 144E. However, the present invention is not limited thereto, but the part between the predetermined portion 142E and the contact region 17E may be sealed. Thus, the seal trace 16E should be formed at least between the contact region 17E and the cutting edge 144E.

The film member of the fourth modification and the fifth modification described above is a single planar sheet or a single folder-like sheet. However, the film member of the present invention is not limited thereto but can be modified variously.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A device comprising a first seal member, a second seal member, a first circuit member, a second circuit member and one or more compressive members, wherein:

the first seal member is formed of a film and has a first inner portion and a first outer portion;

the first inner portion is located inward of the first outer portion;

the second seal member has a second inner portion and a second outer portion;

the second inner portion is located inward of the second outer portion;
the first outer portion has a first seal portion;
the second outer portion has a second seal portion;
the first seal portion and the second seal portion are bonded together to form a seal trace;
the device is formed with a closed space which is enclosed by the first inner portion and the second inner portion;
the first circuit member and the second circuit member are shut in the closed space;
the first circuit member comprises a first contact point;
the second circuit member comprises a second contact point;
the first contact point and the second contact point are in contact with each other;
the compressive members are shut in the closed space;
the compressive members include at least one of a first compressive member and a second compressive member;
the first compressive member is, at least in part, located between the first seal member and the first contact point;
the second compressive member is, at least in part, located between the second seal member and the second contact point;
each of the compressive members has a body and two main surfaces;
the two main surfaces of each of the compressive members are located opposite to each other in a predetermined direction across the body; and
a part of air contained in the body of each of the compressive members is discharged.

2. The device as recited in claim 1, wherein each of the compressive members is an open-cell structure.

3. The device as recited in claim 1, wherein:
the first outer portion has a first contact portion;
the second outer portion has a second contact portion;
the first contact portion and the second contact portion are in contact with each other in a contact region; and
the contact region surrounds the first inner portion and the second inner portion throughout their entire circumference.

4. The device as recited in claim 1, wherein the first seal portion and the second seal portion are bonded together by heat-sealing.

5. The device as recited in claim 4, wherein each of the first seal member and the second seal member includes two layers consisting of a meltable layer which is meltable by the heat-sealing and an unmeltable layer which is not meltable by the heat-sealing.

6. The device as recited in claim 1, wherein the second seal member is formed of a film.

7. The device as recited in claim 3, wherein:
the first seal member and the second seal member are two sheet pieces of a single film member which overlap with each other;
the film member has a predetermined portion and a cutting edge;
the first seal member and the second seal member are connected to each other at the predetermined portion; and
the seal trace is formed at least between the contact portion and the cutting edge.

8. The device as recited in claim 7, wherein:
the film member is a single planar sheet; and
the first seal member and the second seal member are the two sheet pieces which are folded at the predetermined portion to overlap with each other.

9. The device as recited in claim 7, wherein:
the film member is a single folder-like sheet; and
the first seal member and the second seal member are the two sheet pieces which are connected to each other at the predetermined portion.

10. The device as recited in claim 1 wherein each of the first seal member and the second seal member has a high barrier property.

11. The device as recited in claim 10 wherein each of the first seal member and the second seal member has a high barrier property against oxygen.

12. The device as recited in claim 10 wherein each of the first seal member and the second seal member has a high barrier property against water vapor.

13. The device as recited in claim 1, wherein:
the first circuit member has a first base portion and a first conductive pattern;
the first base portion is formed of an insulation film;
the first conductive pattern is formed on the first base portion and has the first contact point;
the second circuit member has a second base portion and a second conductive pattern;
the second base portion is formed of an insulation film; and
the second conductive pattern is formed on the second base portion and has the second contact point.

14. The device as recited in claim 1, wherein:
the first compressive member entirely covers the first circuit member except for an end of the first circuit member; and
the second compressive member entirely covers the second circuit member except for an end of the first circuit member.

15. The device as recited in claim 1, wherein:
at least one of the first circuit member and the second circuit member includes an electronic component;
the electronic component comprises a main portion and a terminal;
the terminal works as one of the first contact point and the second contact point and extends from the main portion toward a remaining one of the first contact point and the second contact point; and
one of the compressive members does not cover the main portion but covers the terminal.

* * * * *